United States Patent
Yin et al.

(10) Patent No.: US 7,890,788 B2
(45) Date of Patent: Feb. 15, 2011

(54) CLOCK DATA RECOVERY AND SYNCHRONIZATION IN INTERCONNECTED DEVICES

(76) Inventors: John Yin, 3242 Puttenham Way, Fremont, CA (US) 94536; Bryan H. Hoyer, 416 Owl Ridge Rd., Boulder Crddk, CA (US) 95006

( * ) Notice: Subject to any disclaimer, the term of this patent is extended or adjusted under 35 U.S.C. 154(b) by 889 days.

(21) Appl. No.: 11/774,977

(22) Filed: Jul. 9, 2007

(65) Prior Publication Data
US 2009/0015304 A1 Jan. 15, 2009

(51) Int. Cl.
*G06F 1/00* (2006.01)
(52) U.S. Cl. ....................................................... 713/500
(58) Field of Classification Search ................... 713/500
See application file for complete search history.

(56) References Cited

U.S. PATENT DOCUMENTS

| 6,212,247 | B1 | 4/2001 | Olafsson |
| 6,275,544 | B1 * | 8/2001 | Aiello et al. ................. 375/326 |
| 6,363,129 | B1 | 3/2002 | Agazzi |
| 6,661,810 | B1 | 12/2003 | Skelly et al. |
| 6,781,984 | B1 | 8/2004 | Adam et al. |
| 6,960,943 | B1 * | 11/2005 | Poulson ....................... 327/105 |
| 7,054,356 | B2 | 5/2006 | Wahl |
| 7,127,645 | B2 | 10/2006 | Toyoda et al. |
| 7,209,907 | B2 | 4/2007 | Cherukuri et al. |
| 7,519,844 | B2 * | 4/2009 | Kizer et al. .................. 713/400 |
| 2002/0105389 | A1 * | 8/2002 | Nishimura et al. .......... 331/100 |
| 2003/0031283 | A1 | 2/2003 | Bronfer et al. |
| 2004/0022307 | A1 * | 2/2004 | Dale et al. ................... 375/222 |
| 2007/0076806 | A1 | 4/2007 | Huang et al. |

OTHER PUBLICATIONS

JEDEC Solid State Technology Association, "Serial Interface for Data Converters", JESD204 JEDEC Solid State Technology Association 2006 2500 Wilson Boulevard Arlington, VA 22201-3834.
Charles E. Spurgeon, "Ethernet: The Definitive Guide", 2000, pp. 166-1667, O'Reilly & Associates, Inc., USA.
Maxim Integrated Products, MAX3634 datasheet, "Clock Phase Aligner for 22/1,244Mbps GPON Burst Mode OLT Applications", 120 San Gabriel Drive, Sunnyvale, CA 94086, tel: 408-737-7600.

* cited by examiner

*Primary Examiner*—Thomas Lee
*Assistant Examiner*—Mohammed H Rehman
(74) *Attorney, Agent, or Firm*—Webb IP Law Group; Jason P. Webb; Danny Y. H. Cheng

(57) ABSTRACT

For synchronizing a master device and a slave device connected by a data transfer link, the master device measures a phase offset in a signal received from the slave device with respect to the master's clock signal. The master determines a control symbol based on the phase offset. The master encodes the control symbol in a transmit signal for the slave. The slave decodes the control symbol from the signal received from the master. The slave uses the control symbol to adjust the phase shift to compensate for the phase offset of a signal to be transmitted to the master device. When the phase compensated signal is received at the master, its phase offset is smaller than the original phase offset. This procedure can be performed iteratively until the phase offset is within a desired tolerance.

40 Claims, 14 Drawing Sheets

CLOCK DATA RECOVERY AND SYNCHRONIZATION IN INTERCONNECTED DEVICES

BACKGROUND OF THE INVENTION

This invention relates to computationally efficient clock data recovery and synchronization in systems with interconnected devices having high rates of data transfer between devices.

Several trends in system design are increasing the demand for data transfer in interconnected devices. The volume of data requiring transfer between digital devices are constantly increasing, driving a requirement for higher data transfer rates. As an example, more digital signal processing applications are being performed by field programmable gate arrays (FPGAs) instead of conventional digital signal processors. System designs require more interconnections between FPGA devices and between FPGA devices and other devices. In the past, interface architectures among multiple devices have typically used parallel connections. The major drawback of parallel connections among multiple processing devices is a proliferation of input/output (I/O) pins. To avoid this, the trend in current designs is to use high speed serial links. Currently, device connections within a system are migrating from parallel backplanes to serial links.

Digital devices inherently require a clock for timing internal and external operations. For serial links, synchronization of the clocks at the transmitting device and the receiving device is critical for successful data transfer. A loss of synchronization may jeopardize the integrity of the data. The clock provides the time base used to control the transfer of digital information. Reliable link design for two chips on a board include source synchronous design, where the transmitting device, or source, provides the data and a clock signal. The receiving device then synchronizes to the received clock signal. For communication between boards, there is a need to minimize the number of wires, so a separate clock signal on a separate wire is not used. Instead, the transmitting device embeds the clock signal in the data. The receiving device recovers the clock signal embedded in the received signal.

Recovering the clock signal is referred to as clock data recovery (CDR) or clock recovery. CDR is required for two basic purposes: first, to establish a timing signal to sample the incoming pulses or signal and second, to transmit outgoing pulses or signal at the same rate as that of the incoming signal. A CDR module includes a phase lock loop (PLL). The PLL locks to the frequency and phase of an input signal and generates an output signal that is synchronized to the input signal. This output signal can be used as a clock signal. For this discussion, "clock" and "clock signal" both refer to a timing signal. Also for this discussion, a "clock source" generates a clock signal that is independent of any other clock signal in the system.

A system that includes an analog to digital converter (ADC) connected to a digital processor is a preferred implementation for many applications. Typically, an ADC is on the same board as the digital processor. This is a disadvantage for some applications. For example, in a digital radio system, transferring the received analog signal from an antenna or analog front end (AFE) to the ADC requires expensive cables for radio frequency (RF) signals. Positioning the ADC near the AFE improves signal reception and would allow the received analog signal to be digitized and transmitted the over a lower cost digital link. However, the digital signal processing portion would require a computationally expensive CDR module for the digital link. It would be advantageous to avoid consuming the resources of the digital signal processing portion of the system with CDR operations. For applications that transfer data between a remote ADC and a digital signal processing device, efficient clock recovery would conserve system resources.

Clock data recovery is an important component of communication systems and data networks. There are two major strategies for clock synchronization, one used in telecommunication systems, described herein as the telecom model, and the other used in data networks, described herein as the datacom model. Both models include CDR modules for synchronization on both sides of the communications link.

In the telecom model, a typical arrangement for a communication system includes a master station and one or more slave stations, each station including a transmitter (TX) and a receiver (RX). The master station and the slave station each include a CDR module for the received signal. The master includes a clock source for its TX. The master transmits the clock signal from the clock source in addition to data embedded in the transmitted signal. The slave station includes a CDR module to synchronize to the received clock signal. The output of the CDR module is the recovered RX clock signal. The slave station uses the recovered RX clock signal to synchronize its TX clock signal. The synchronized TX clock signal is used for timing the slave's transmit signal. At this point, the slave's RX clock frequency matches the TX clock frequency. However, when the master station receives the signal transmitted from the slave, the master still has to synchronize to the phase of the received data, even though the clock frequency is matched. The phase offset is due to propagation delay that is a function of connection length and other distortions. The telecom model is prevalent the digital telephone network and wide area network (WAN) architectures.

In the datacom model, such as in Ethernet networks, the TX and RX of each station have independent timing control. Each station includes a clock source that produces a clock signal that is embedded in the transmitted signal. Each station also includes a CDR module that locks to the embedded clock signal of the signal received from the other station.

In current architectures using the telecom model or the datacom model, a digital device requires CDR for every communication channel with any remote device. Each CDR module includes a computationally expensive PLL. For example, current commercially available FPGAs include various numbers of PLL resources, where low end devices having 0 to 2 PLLs and high end devices having 4 to 8 PLLs. In addition, not all FPGA PLLs have the same capability. In specialized high end FPGAs, some of the PLLs are capable of supporting CDR functionality. Other FPGA devices have PLLs with lesser functionality that do not support CDR operations. For systems with multiple interconnected devices, the cost and complexity for communication among devices increases for every channel. This produces scalability problems, where the overhead for communication becomes prohibitive. The implementation of a PLL on an FPGA is physically large on the die. Therefore, the PLL is the most expensive resource on the FPGA. There is a need to reduce the number of PLLs required for communication in systems having interconnected FPGAs and other devices. Reducing the requirements for PLLs conserves the most precious resource of the FPGA, thus reducing the cost and complexity of the system. Similarly, for device implementations using an application specific integrated circuit (ASIC), digital signal processor, microcontroller or microprocessor, reducing the number PLLs conserves resources for other application tasks. The present invention addresses this need and others as described below.

SUMMARY OF THE INVENTION

An object of the present invention is to provide a method and an apparatus for synchronizing interconnected devices in a system using fewer system resources than comventional systems. For a system having two devices, a master device and a slave device, connected by a data transfer interface, or link, the master device includes a phase comparator that measures a phase offset in a signal received from the slave device with respect to the master's clock signal. The master includes a control symbol generator that determines a control symbol based on the phase offset. The master includes an encoder that encodes the control symbol in a transmit signal for the slave. The slave includes a decoder that decodes the control symbol from the signal received from the master. The slave uses the control symbol to adjust the phase shift of a signal to be transmitted to the master device. The phase shift is adjusted to compensate for the phase offset that occurs due to propagation over the link to the master. When the phase compensated signal is received at the master, its phase offset is smaller than the original phase offset. This procedure can be performed iteratively until the phase offset is within a desired tolerance.

Another object of the invention is to make systems with interconnected devices more scalable by reducing the communications overhead. In a system with a master device in communication with a plurality of slave devices over a plurality of links, the master includes a phase comparator, a control symbol generator and an encoder for each slave device. The master produces and transmits a corresponding control symbol to each slave device. Each slave device applies its corresponding control symbol to adjust the phase shift of its transmit signal. The transmit signal of each slave is phase compensated prior to transmission over the corresponding link to the master. Each resulting received signal at the master has a reduced phase offset as described above.

Another object of the invention is to reduce the complexity of the slave device by performing the phase compensation at the master device. The master device includes a phase adjuster in addition to the phase comparator. The phase adjuster applies a phase shift to a signal received from the slave to reduce the phase offset. Alternatively, the phase adjuster applies a phase shift to the its transmit signal. The slave's PLL locks to the phase shift in the signal received from the master. In response to the phase shifted clock signal generated by the PLL, the slave produces a phase compensated signal for transmission to the master. When the phase compensated signal is received at the master, the resulting received signal will have a smaller phase offset than the previous received signal.

Another object of the invention is to provide efficient implementation for an analog to digital converter (ADC) application. The slave device includes an ADC that produces digital signal samples from an input analog signal. The slave device encodes the signal samples to form a transmit signal for the master. The procedures described above will result in a phase compensated signal at the master.

An advantage of the present invention is the reduced complexity in a system of interconnected devices and lower communications overhead. Another advantage is that the accuracy of the synchronization is not sacrificed in order to achieve lower complexity. Another advantage is that the lower complexity reduces system cost.

DETAILED DESCRIPTION

Figure 1:
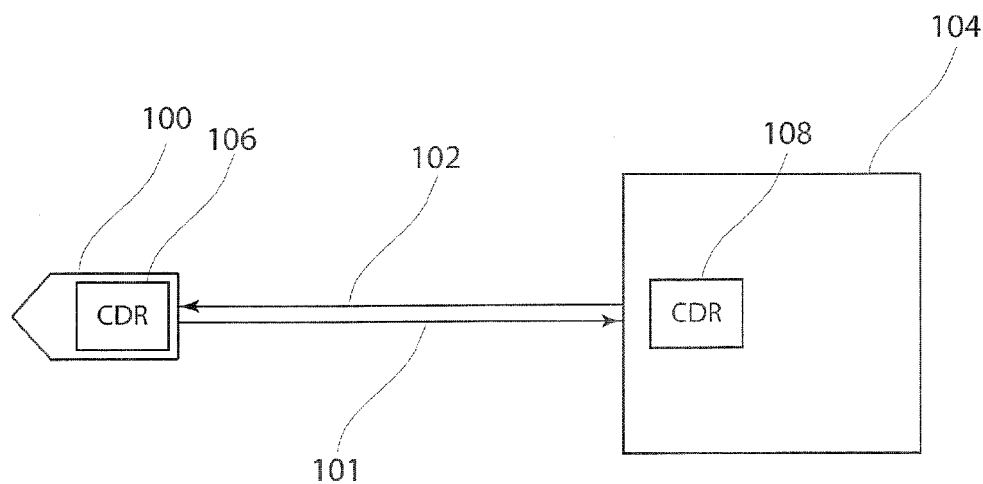
FIG. 1 shows an example of an interconnected system that includes a master device with serial links and to a slave device, in accordance with the prior art.
Figure 2:
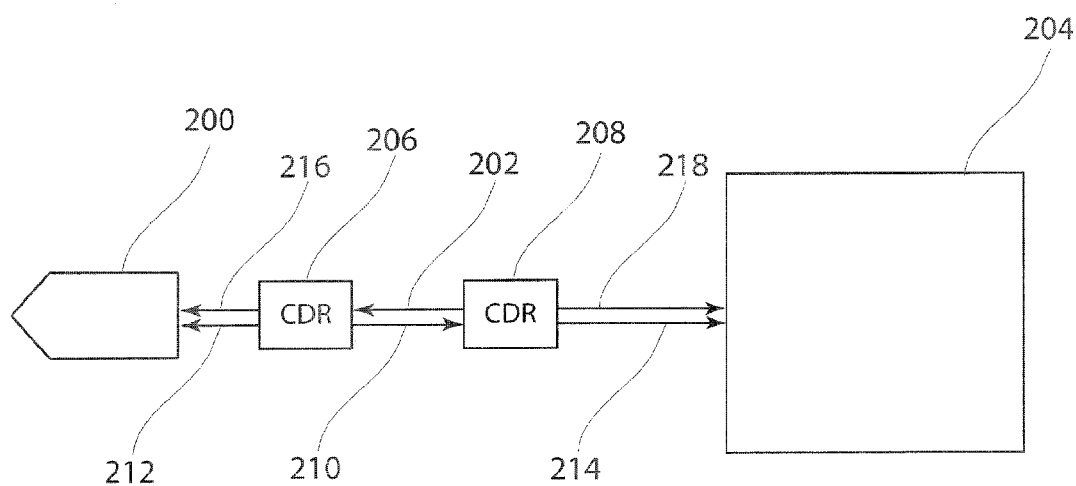
FIG. 2 is a block diagram of a matched chip set where each chip and provides an interface between the respective devices and the respective links, in accordance with the prior art.

In any interconnected system, data transfer between devices requires the receiving device to synchronize to signals received from the transmitting device. FIG. 1 shows an example of an interconnected system that includes a master device 104 with serial links 101 and 102 to a slave device 100. The master device 104 and the slave device 100 each include a CDR module, 108 and 106, respectively, to recover the clock from the their respective received signals. As described above in the Background section, the PLL required for conventional CDR can consume a prohibitive amount of resources. Current solutions for this situation include commercially available matched chip sets. FIG. 2 shows a block diagram of a matched chip set where each chip, 206 and 208, provides an interface between the respective devices 200 and 204 and the respective links, 202 and 210. The matched chips 206 and 208 perform the CDR functions, including the PLL, and provide the recovered clocks 212 and 214 and the received signals 216 and 218 to their respective devices, thus conserving the resources of the devices 200 and 204 themselves.

Figure 3:
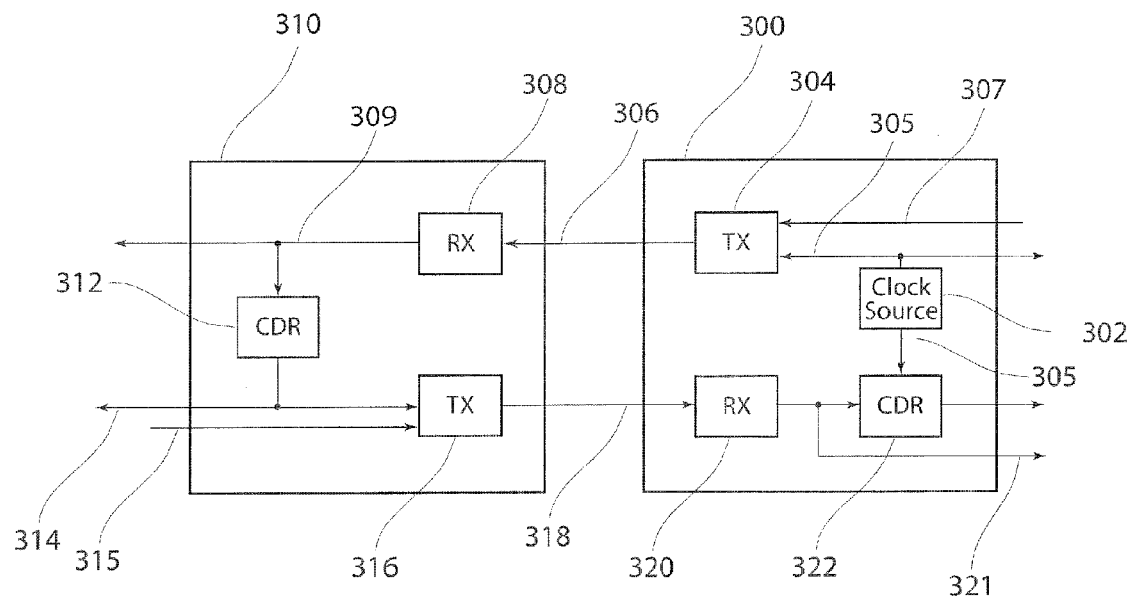
FIG. 3 is a block diagram of the telecom model for timing control, in accordance with the prior art.

FIG. 3 is a block diagram of the telecom model for timing control. The master device 300 includes a clock source 302 for generating a clock signal 305 for the TX 304. The clock signal 305 is embedded in the signal to be transmitted along with the TX data 307. The transmit signal is transferred over a link 306 to the RX 308 of the slave device 310. The CDR module 312 in the slave device 310 applies a PLL to lock to the frequency and phase of the received signal 309. The CDR module 312 provides a clock signal 314 to the slave device's TX 316. The clock signal 314 is embedded along with data 315 in the signal to be transmitted by the TX 316. The master's RX 320 receives the slave's transmitted signal from link 318. At this point, the master's clock source 302 and the slave's TX clock, and consequently the embedded clock signal in the received signal 321, have matched frequencies. Ideally, the frequencies are the same. In reality, any frequency difference is within an acceptable tolerance. However, the phase of the master clock signal 305 is offset with respect to the received signal 321 because of propagation effects. The master requires a CDR module 322 that includes a PLL to lock to the phase of the received signal.

Figure 4:
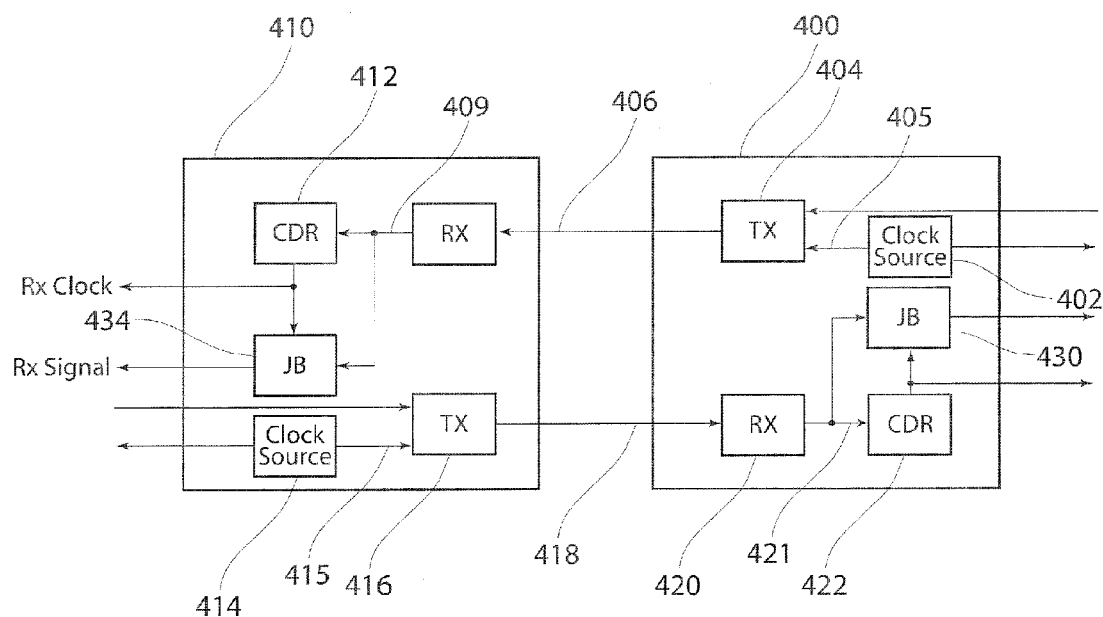
FIG. 4 is a block diagram of the datacom model for timing control, in accordance with the prior art.

FIG. 4 is a block diagram of the datacom model for timing control. The first device 400 and the second device 410 communicate via links 406 and 418. Each device 400 and 410 includes a clock source 402 and 414, respectively, and a CDR module, 422 and 412, respectively. Each device 400 and 410 embeds its clock signal 405 and 415, respectively, in the signal to be transmitted. Each CDR module 422 and 412 locks to the frequency and phase of its received signal 421 and 409, respectively. There are no means for synchronizing the clocks of the two devices, so in addition to phase offset, the frequencies of the clocks can be slightly different. Normally the accuracy of the clock frequency is specified as part of an industry standard for the devices in the network. Typical frequency tolerance levels are 50 to 100 ppm. The jitter buffers 430 and 434 store the respective received signals 421 and 409 and compensate for frequency and phase differences.

Figure 5:
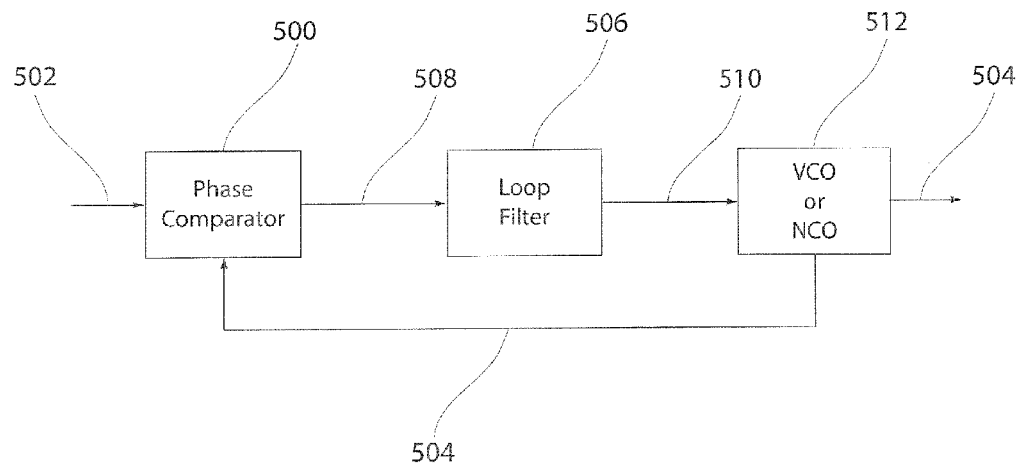
FIG. 5 is a block diagram of the basic structure of a PLL, in accordance with the prior art.

Each device in the systems represented in FIGS. 1 through 4 requires a CDR module that includes a PLL. The structures and techniques for PLLs are well known in the art. The basic structure of a PLL is shown in FIG. 5. The phase comparator 500 measures the phase offset, or skew, in the received signal 502 by comparing it to the phase of a reference signal 504 output from a controlled oscillator 512. The controlled oscillator 512 is a voltage controlled oscillator (VCO) in an analog PLL or a number controlled oscillator (NCO) in a digital PLL. The loop filter 506 smoothes the phase error 508 to generate a control signal 510 for the controlled oscillator 512. Based on the control signal 510, the controlled oscillator 512 adjusts its oscillations to more closely match the frequency and phase of the input signal 502.

Embodiments of the present invention eliminate the need for one PLL in one of the two communicating devices shown in FIGS. 1, 3 and 4. In the architecture of FIG. 2, an embodiment of the present invention may eliminate the need for one of the matched chips or greatly reduce its complexity.

Figure 6:
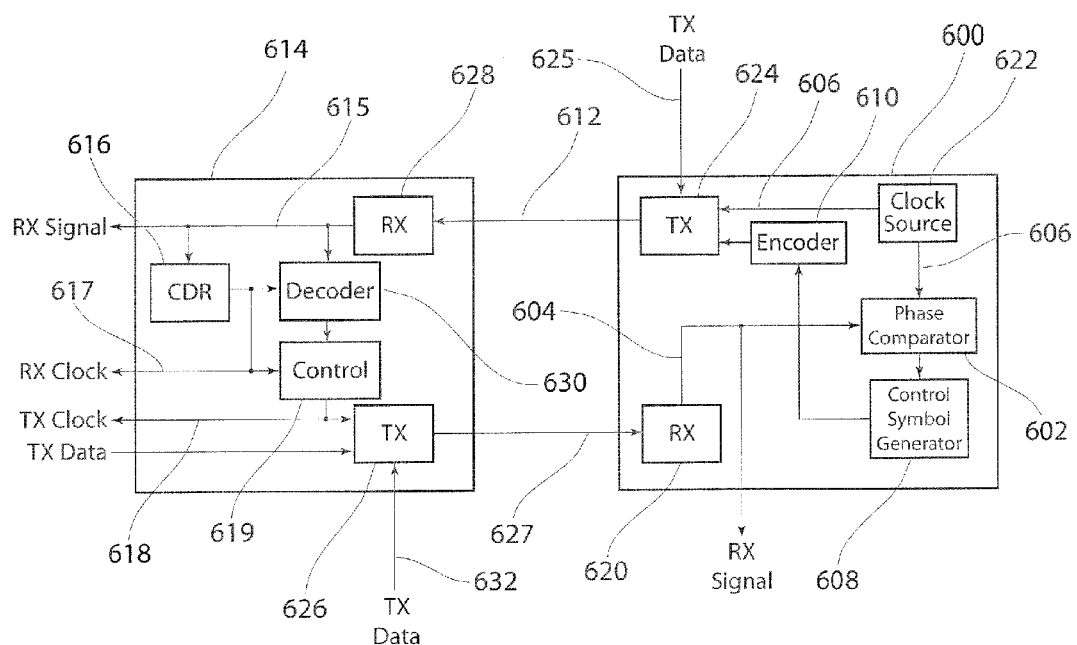
FIG. 6 is a block diagram of a preferred embodiment for the telecom model.

FIG. 6 is a block diagram of a preferred embodiment for the telecom model. The master device 600 includes a phase comparator 602 that compares the received signal 604 to the clock signal 606 to measure a phase offset, or skew. The control symbol generator 608 determines a control symbol based on the phase offset. Encoder 610 encodes the control symbol so that it occupies available control channels of the transmit data 625. The functions of encoder 610 can be included in the encoding operations for control data and payload data that normally occur for preparing TX data 625 for transfer as a transmit signal. The TX 624 transfers the transmit signal with the embedded control symbol via link 612 to the slave device 614. The receiver 628 receives the transmit signal to form the received signal 615. The decoder 630 extracts the control symbol from the received signal 615 and inputs it to the control module 619. The functions of the decoder 630 can be included in the decoding operations that normally occur for extracting control data and payload data from the received signal 615. The CDR module 616 produces an RX clock signal 617 as described for the previous example of FIG. 3. The control module 619 adjusts the phase of the RX clock signal 617 according to the control symbol to form a phase compensated TX clock signal 618. Using the phase compensated TX clock signal 618, the TX 626 forms a phase compensated transmit signal for TX data 632. The phase compensation mitigates the phase shifts in the transmit signal that occur during propagation over the link 627. As a result of the phase compensation by the slave, the master's receiver 620 produces a received signal 604 that is synchronized in the phase and frequency with the master's clock signal 606. The phase compensation provides the same degree of accuracy as if there were a local CDR module at the master.

The control symbol represents the phase adjustment applied to the slave's transmit clock signal 618. The control symbol can represent one or more phase adjustment parameters, including a phase correction value, a phase step size (granularity), a number of phase steps, a delay interval corresponding to the phase correction, a polarity indicator and other representations.

Figure 7:
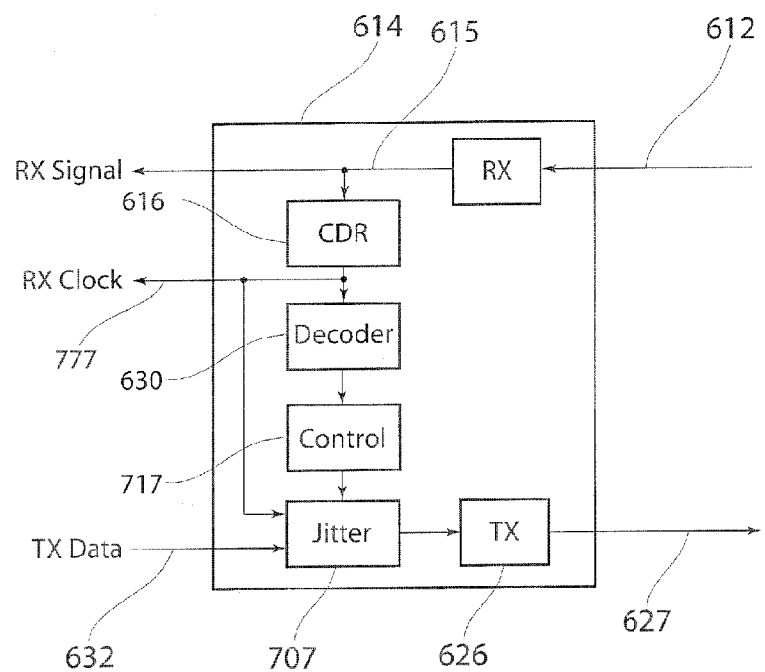
FIG. 7 is a block diagram of an alternative embodiment of the slave device that includes a jitter buffer.

The controller 619 applies the phase adjustment to the recovered clock signal 617, output by the CDR module 616, to produce a phase shifted clock signal, the TX clock signal 618, at its output. The RX clock signal 617 results from the conventional clock recovery operation of the PLL in the CDR module 616. The TX clock signal 618 is a phase shifted version of the RX clock signal 617 resulting from the phase compensation in accordance with the control symbol. In an alternative embodiment for the telecom model, the slave's CDR module 616 produces one clock signal in the slave device. Since the slave's CDR module 616 has matched the frequency of the master clock source 622, the phase adjustment can be implemented by delaying the slave's transmit signal by a time interval that compensates for the phase offset. FIG. 7 is a block diagram of an alternative embodiment of the slave device 614 that includes a jitter buffer 707. The clock signal 777 functions as both the RX clock and the TX clock. Upon receiving the decoded control symbol, the controller 717 produces a time shift control parameter for the jitter buffer 707. In this embodiment, the phase adjustment is converted to a corresponding time shift adjustment to produce the time shift control parameter. Alternatively, the corresponding time shift adjustment can be calculated by the control symbol generator 608 in the master device 600 to produce the control symbol for transfer to the slave device 614.

Figure 8:
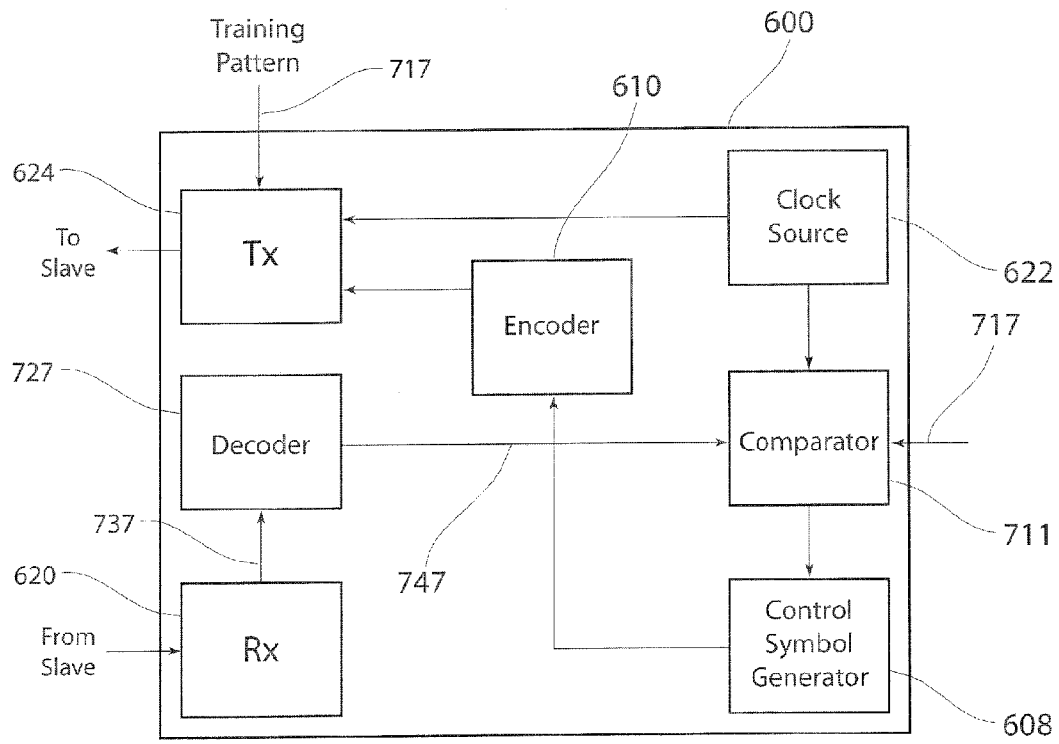
FIG. 8 is a block diagram for an alternative embodiment for the master that applies data comparisons instead of phase comparisons.

FIG. 8 is a block diagram for an alternative embodiment for the master 600 that applies data comparisons instead of phase comparisons. The master 600 transmits a training pattern 717 to the slave 614 during a training period. The slave 614 receives the transmitted training pattern and retransmits it to the master 600 in a loopback procedure. Loopback procedures are well known to those of ordinary skill in the art. The master's receiver 620 receives the loopback signal. The data decoder 727 decodes the pattern from the received loopback signal 737. The data comparator 711 determines the shift in the received pattern 747 relative to the test pattern 717 using methods well known to those skilled in the art. The control symbol generator 608 produces a control symbol based on the detected shift. The control symbol is then encoded and transmitted to the slave as described previously with respect to FIG. 6.

Figure 9:
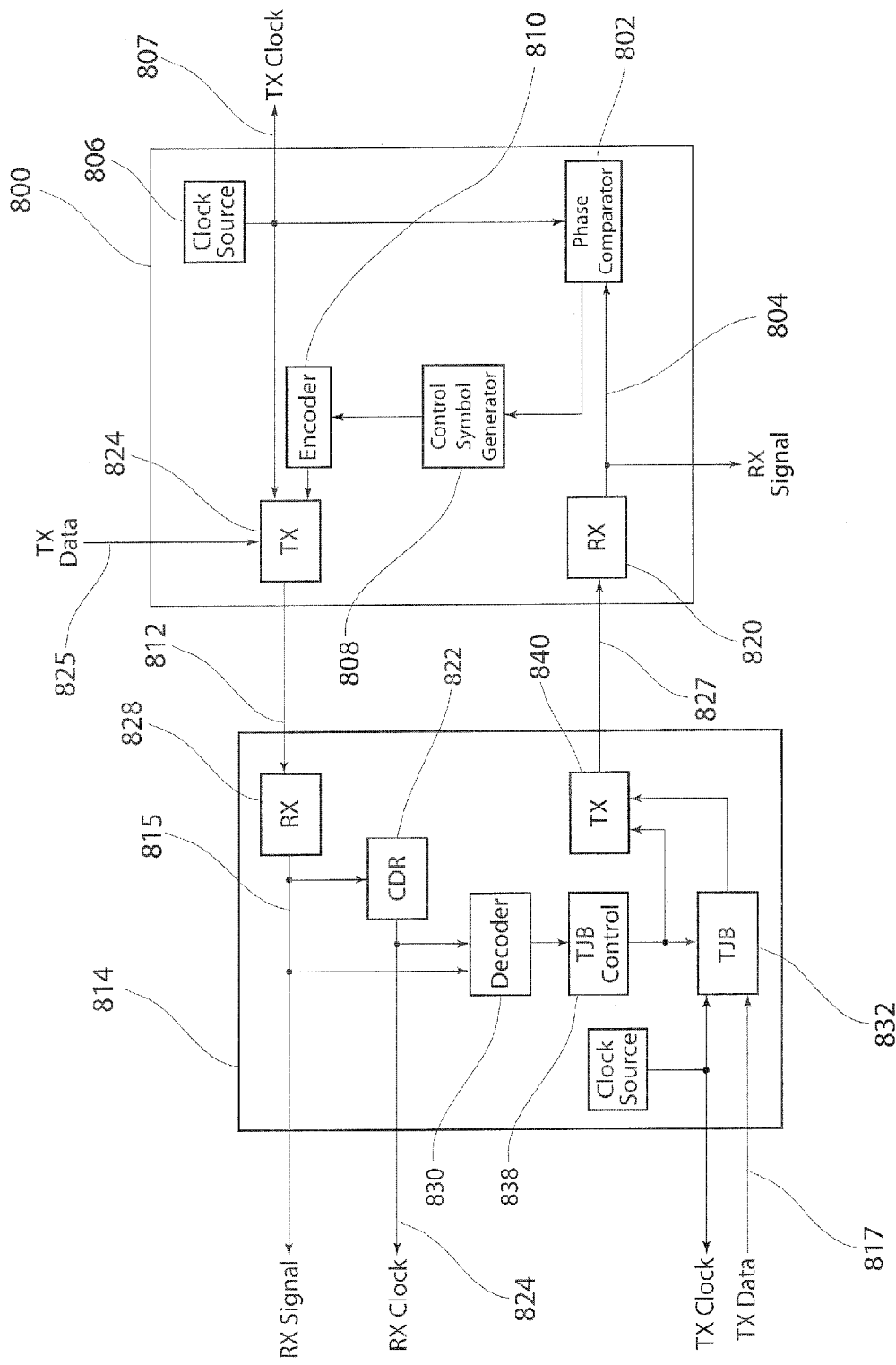
FIG. 9 shows a block diagram for an embodiment for the datacom model.

FIG. 9 shows a block diagram for a preferred embodiment for the datacom model. In the conventional datacom model described above with respect to FIG. 4, the first device 400 and the second device 410 include the same elements. In an embodiment for the present invention, the communicating devices in the datacom model have some different elements. The communicating devices will now be referred to as a master device 800 and a slave device 814. The master device 800 includes a phase comparator 802 that determines the phase offset, or skew, of the received signal 804 with respect to the clock signal 807 using techniques well known to those skilled in the art. The control symbol generator 808 produces a control symbol based on the phase offset. The encoder 810 encodes the control symbol for portions of the transmit data 825 that are used for control data. The functions of encoder 810 can be included in the encoding operations for control data and payload data that normally occur for preparing TX data 825 for transfer. The transmitter 824 transmits the TX data 825 with the embedded control symbol via the link 812 to the receiver 828 of the slave device 814. The slave device 814 includes CDR module 822 to recover the RX clock signal 824 from the received signal 815. The decoder 830 decodes the control symbol from the received signal 815 and provides it to transmit jitter buffer controller 838. The functions of the decoder 830 can be included in the decoding operations that normally occur for extracting control data and payload data from the received signal 815. The slave device 814 also includes a transmit jitter buffer 832 that stores transmit data 817. The transmit jitter buffer controller 838 determines a shift control parameter based on the decoded control symbol. The transmit jitter buffer 832 applies a shift adjustment according to the shift control parameter to produce a phase compensated transmit signal. The transmitter 840 transmits the phase compensated transmit signal over link 827 to the receiver 820 of the master 800. The phase shifts due to propagation effects are mitigated by the compensating phase adjustment provided by the slave 814 prior to transmission. Because of the phase compensation, the received signal 804 is synchronized with the TX clock signal 807. The accuracy of the synchronization is substantially the same as that of a local PLL in a CDR module at the master 800.

Figure 10:
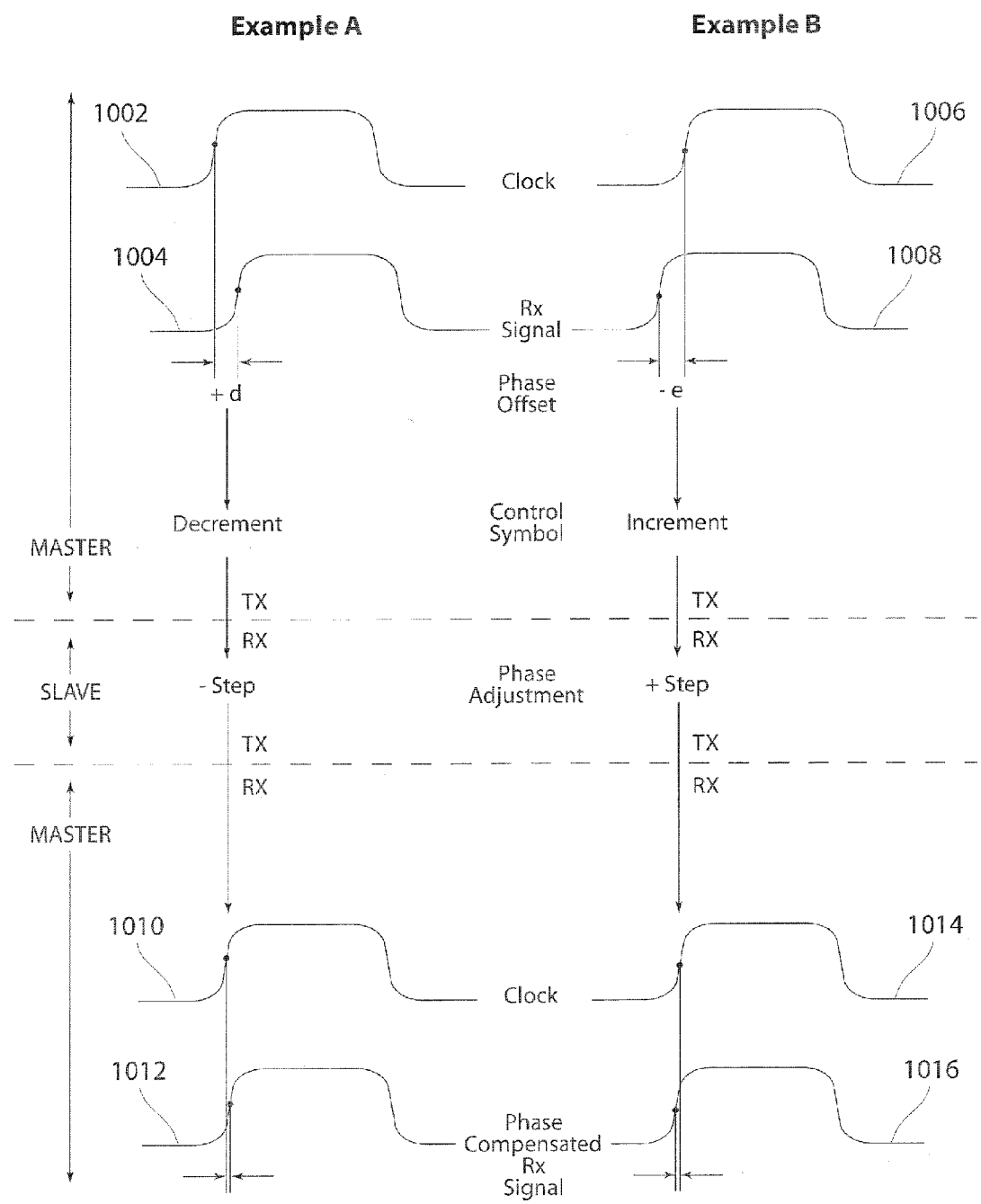
FIG. 10 illustrates examples of measuring phase offset and determining a control symbol, in accordance with the embodiments of FIG. 6 and FIG. 9.

The embodiments of the telecom model of FIG. 6 and the datacom model of FIG. 9 each include a phase comparator 602 and 802, respectively, and a control symbol generator 608 and 808, respectively. The phase comparators 602 and 802 can apply techniques well known in the art for calculating phase offset. FIG. 10 illustrates examples of measuring phase offset and determining a control symbol. In a preferred embodiment, the phase offset is calculated by comparing the 50% rise time of at least one pulse of the TX clock signal 606 or 807 to the 50% rise time of a pulse in the received signal 604 or 804. A preferred embodiment includes a predetermined phase step size that is known at both the master and the slave. The control symbol generator produces a control symbol that instructs the slave to increment or decrement the phase by the phase step size. The phase compensation at the slave produces a positive phase step or a negative phase step. Referring to FIG. 10, Example A illustrates a received signal pulse 1004 whose 50% rise time is delayed compared to the clock pulse 1002 by an amount +d. The control symbol generator produces a control symbol based on the polarity of the phase offset. In this case, the control symbol represents a decrement command. At the slave station, the decrement command causes a phase adjustment of (− step). In the telecom model of FIG. 6, the (− step) is applied to the PLL in the CDR module 616. In the datacom model of FIG. 9, the (− step) is applied by the transmit jitter buffer controller 828 to the transmit jitter buffer 832. The phase adjusted transmit signal results in a received signal 1012 that is more phase aligned with the master clock signal 1010. Example B illustrates a received signal pulse 1008 whose 50% rise time is ahead of the clock pulse 1006 by an amount −e. In this case, the control symbol generator produces a control symbol for an increment command. At the slave station, the increment command causes a phase adjustment of (+ step). The phase adjusted transmit signal results in a received signal 1016 that is more phase aligned with the master clock signal 1014. The phase adjustments can continue iteratively until phase alignment is achieved within an acceptable tolerance. The accuracy of phase alignment will be the substantially the same as that of a conventional CDR module at the master using the same adjustments by positive or negative steps. One of ordinary skill in the art will appreciate that alternative strategies can be applied for phase offset measurement and phase adjustment. Alternatives include but are not limited to:

1) at the master, calculating the average of several phase offsets and generating the control symbol based on the average phase offset, 2) using variable step sizes for phase adjustments.

The master can transmit the control symbol using control channels of a transmit signal carrying valid data. Alternatively, the master can transmit the control symbol in an idle signal. An idle signal is transmitted during an idle state or invalid state when payload data are not transmitted. A preferred embodiment uses 8B/10B encoding known to those skilled in the art and described in the book, "Ethernet the Definitive Guide" by Charles E. Spurgeon, pages 166-7. An 8B/10B encoder uses 10 bits to encode 8 bit data words. This maps 256 data words, corresponding to 8 bits, to 1024 possible words. Some of the 768 spare words are used for control words and others are not used. The encoder 606 for the telecom model and the encoder 810 for the datacom model can encode the control symbol using one or more of the spare words. For embodiments using a training pattern, such as that depicted in FIG. 8, the master can embed the training pattern in an idle signal or in a portion of a transmit data frame reserved for control data.

Figure 11:
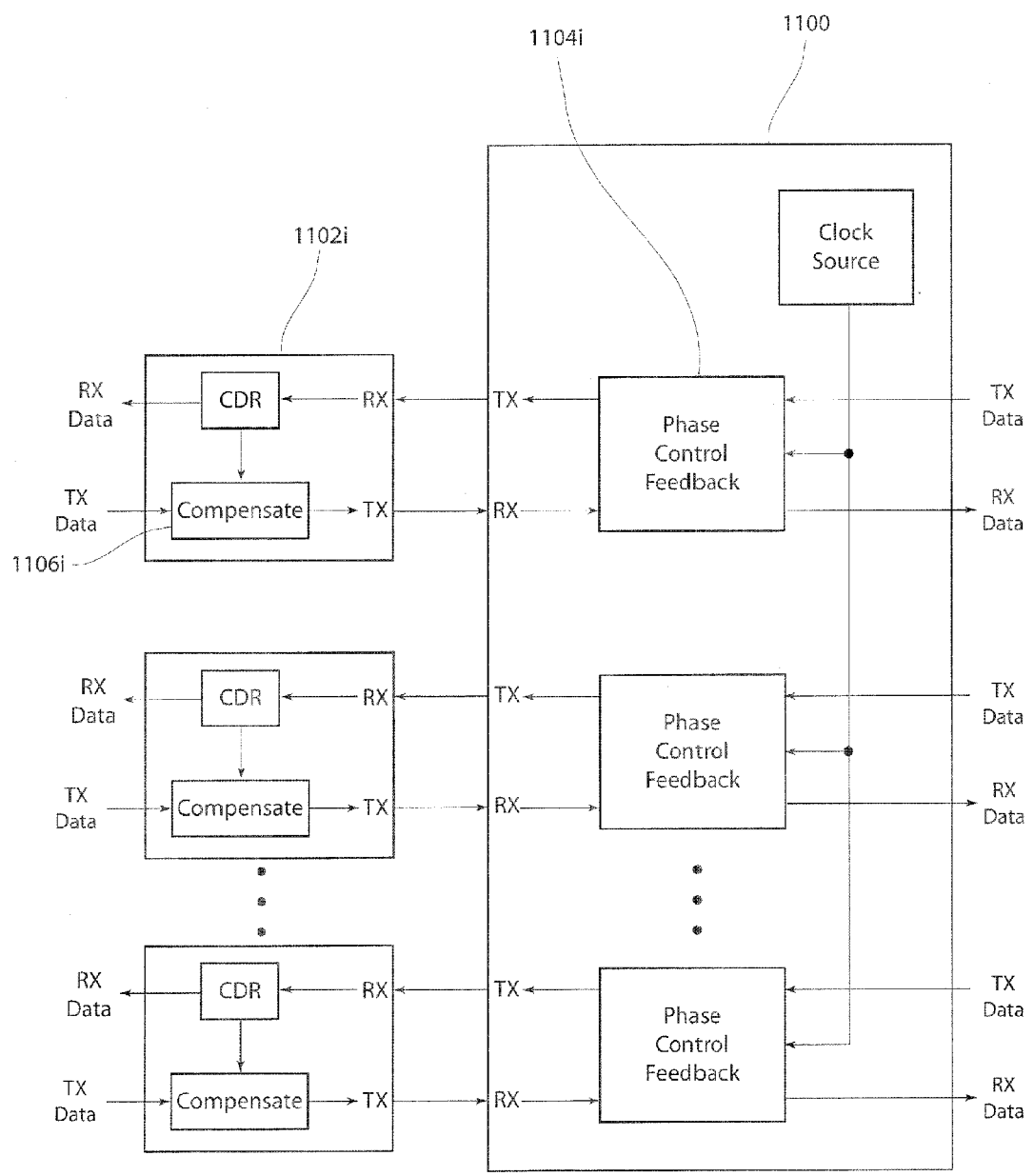
FIG. 11 is a block diagram of an embodiment including a master device in communication with multiple slave devices.

FIG. 11 is a block diagram of an embodiment including a master device 1100 in communication with multiple slave devices 1102*i*. Each of the slave devices 1102*i* includes a phase compensation block 1106*i* that uses an $i^{th}$ control symbol to apply a phase shift in the transmit data as described above with respect to FIGS. 6, 7 and 9. The master device 1100 includes a phase control feedback processor 1104*i* that measures the phase offset in the $i^{th}$ received signal from the $i^{th}$ slave device, as described above with respect to FIGS. 6, 8 and 9. The $i^{th}$ phase control feedback processor 1104*i* generates an $i^{th}$ control symbol which is encoded for transmission to the $i^{th}$ slave device. The phase control feedback processor 1104*i* can replace the PLL that would be required for each link in a conventional architecture.

In the embodiments described thus far, the phase feedback control loop passes from the master to the slave and the phase compensation is performed at the slave. The phase control feedback ultimately results in a phase compensated receive signal at the master. These embodiments are advantageous for conserving the resources of the master device. Removing the computationally expensive PLL that would otherwise be required for each link and replacing it with simpler phase comparison frees resources at the master device for other operations in the application.

In the embodiments described in the following with respect to FIGS. 12 to 18, the phase feedback control loop including phase adjustment is performed at the master. These embodiments are preferable when there are resources available for phase adjustment at the master and it is desirable to conserve resources at the slave. These embodiments are more efficient than conventional architectures because they do not include a PLL at the master.

Figure 12:
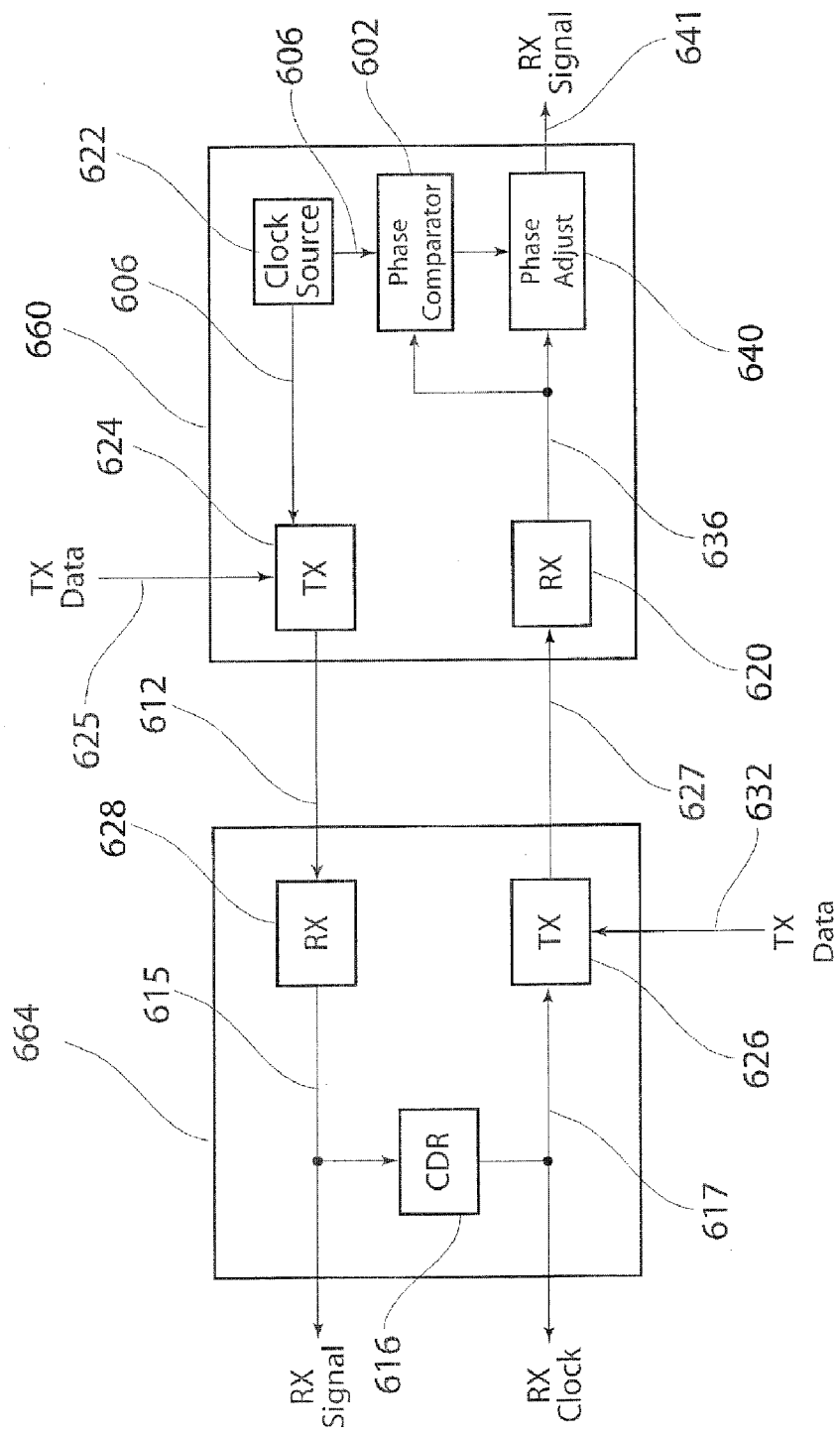
FIG. 12 is a block diagram of a preferred embodiment where the master adjusts its received signal to compensate for phase offset.

FIG. 12 is a block diagram of a preferred embodiment where the master adjusts its received signal to compensate for phase offset. The architecture of the slave 664 is like that of the slave 310 in the conventional architecture for the telecom model as described with respect to FIG. 3. The recovered clock signal 617 is synchronized with the frequency and phase of the clock signal 606. At the master 660, the received signal 636 and the clock signal 606 are synchronized in frequency, however the phases are different because of propagation delay. The phase comparator 602 measures the phase offset, as described previously with respect to FIG. 6. Alternatively, a data comparator can be used instead of the phase comparator 602, as described previously with respect to FIG. 8. The phase adjuster 640 adjusts the received signal 636 to compensate for the phase offset. The phase compensated RX signal 641 is now synchronized in frequency and phase with the clock signal 606.

Figure 13:
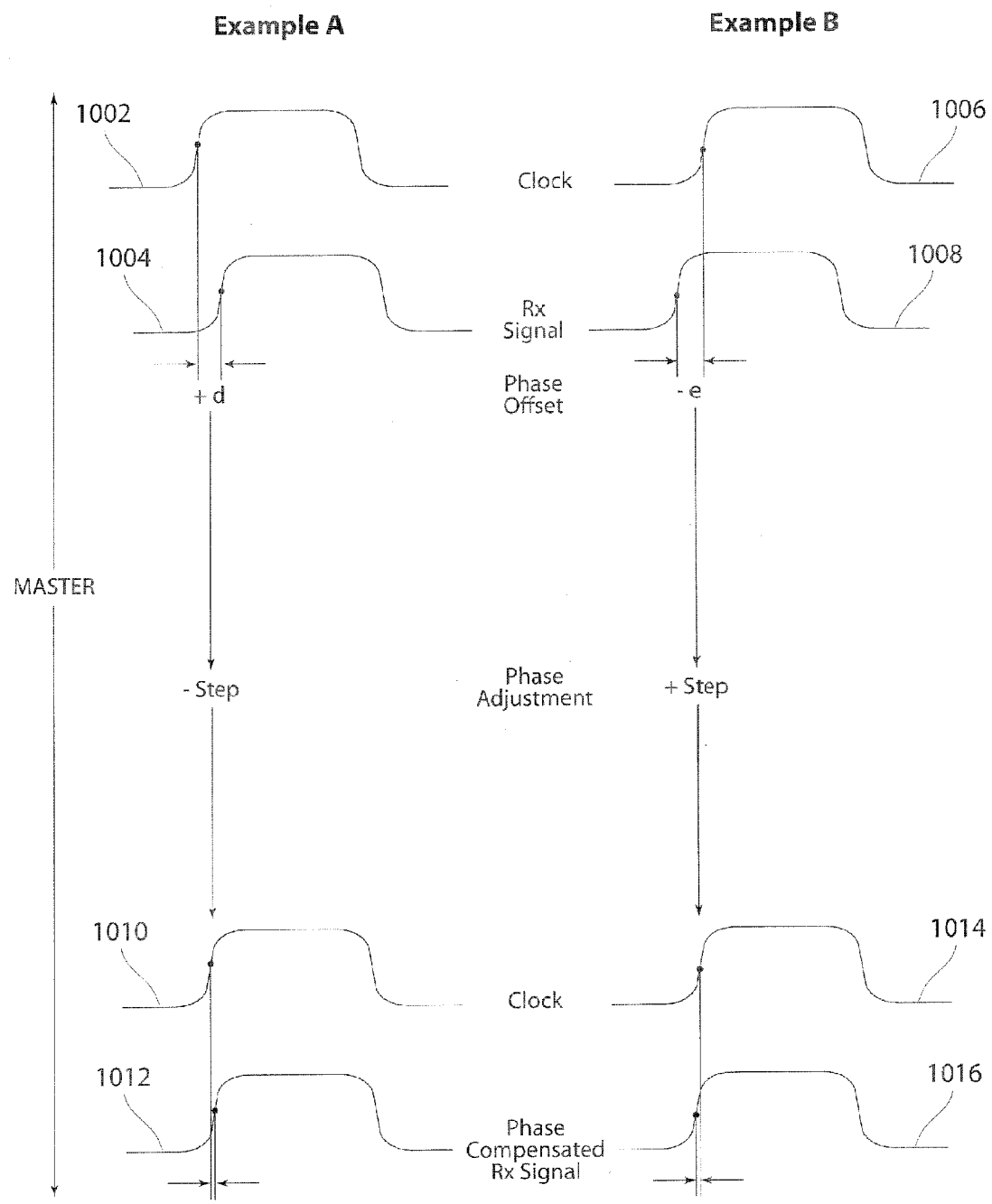
FIG. 13 illustrates examples of signals corresponding to operation of the embodiment of FIG. 12.

FIG. 13 illustrates examples of signals corresponding to operation of the embodiment of FIG. 12. The clock signals 1002, 1006, 1010 and 1014 correspond to clock signal 606. The received signals 1004 and 1008 correspond to received signal 636 in FIG. 12. The measured phase offsets of +d or −e are compensated by phase adjustment (− step) or (+ step), respectively. The phase adjuster 640 applies the step adjustments to the received signal 636 to form phase compensated RX signal 641, corresponding to signals 1012 and 1016 in FIG. 13. These examples are similar to those described with respect to FIG. 10, except that all the phase compensation operations are performed in the master.

Figure 14:
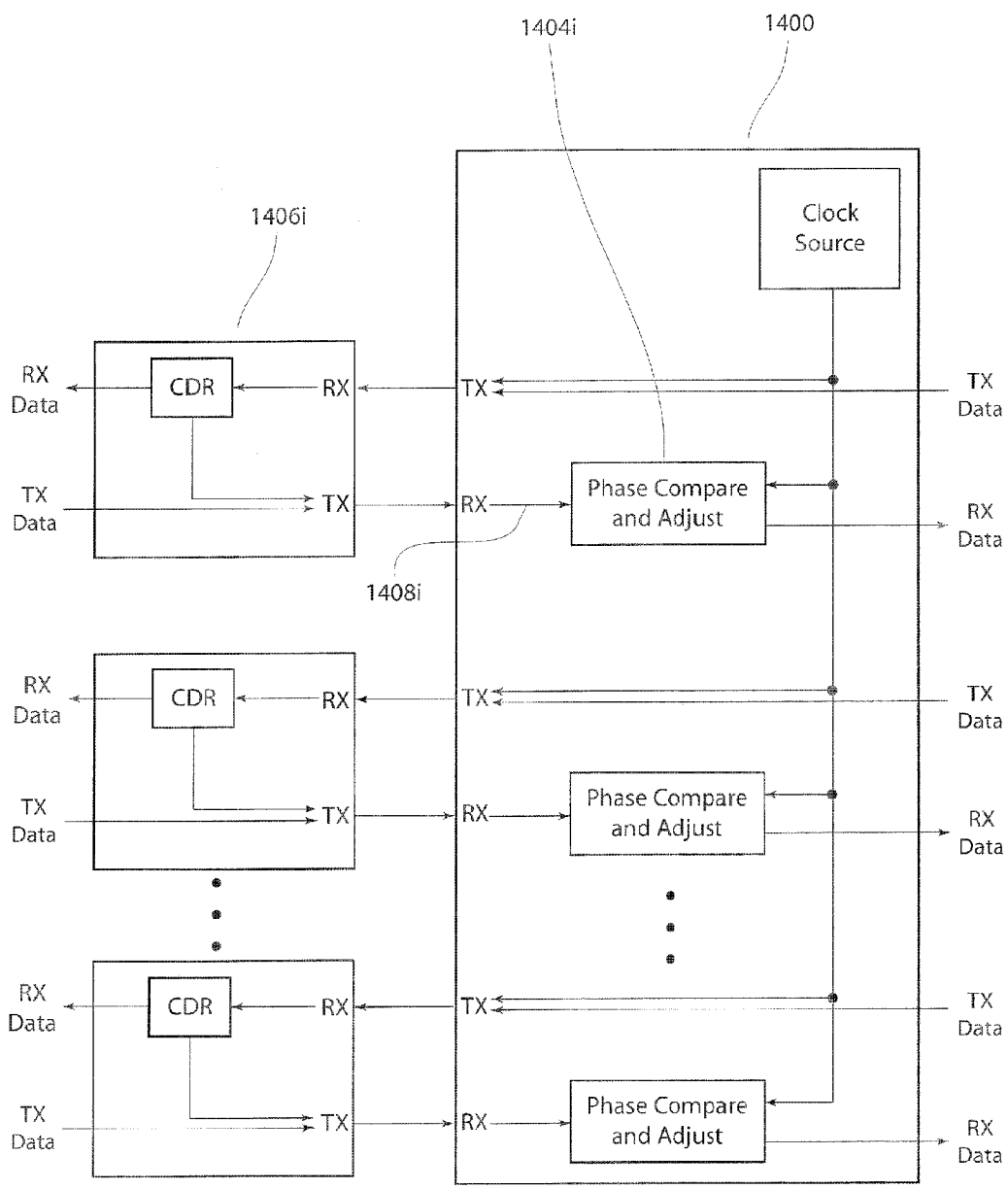
FIG. 14 is a block diagram of a master linked with multiple slave devices corresponding to the embodiment of FIG. 12.

FIG. 14 is a block diagram of a master linked with multiple slave devices corresponding to the embodiment of FIG. 12. The master 1400 includes a phase compare and phase adjust module 1404$i$ for each received signal 1408$i$ from each slave 1406$i$.

Figure 15:
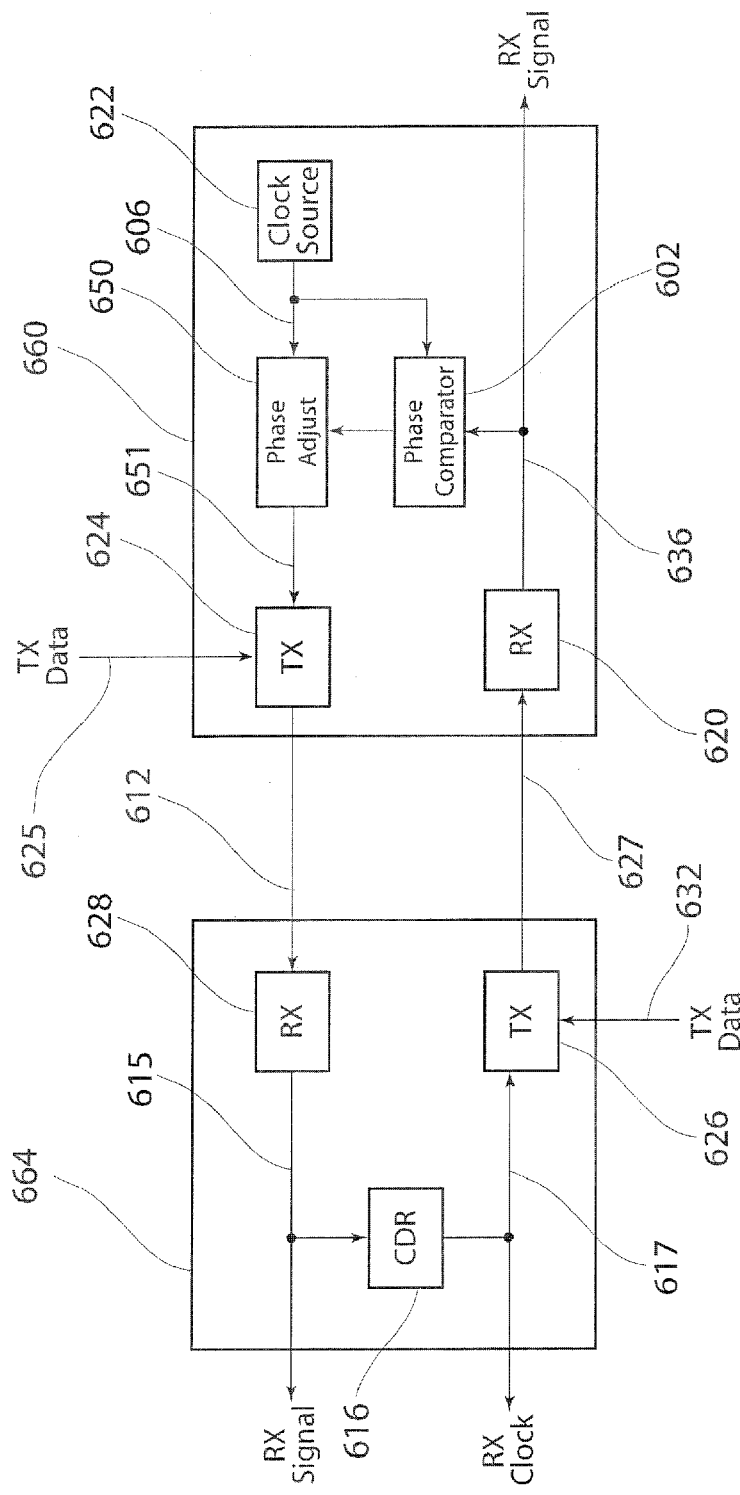
FIG. 15 is a block diagram of a preferred embodiment where the master adjusts its transmit signal to compensate for phase offset in its received signal.
Figure 16:
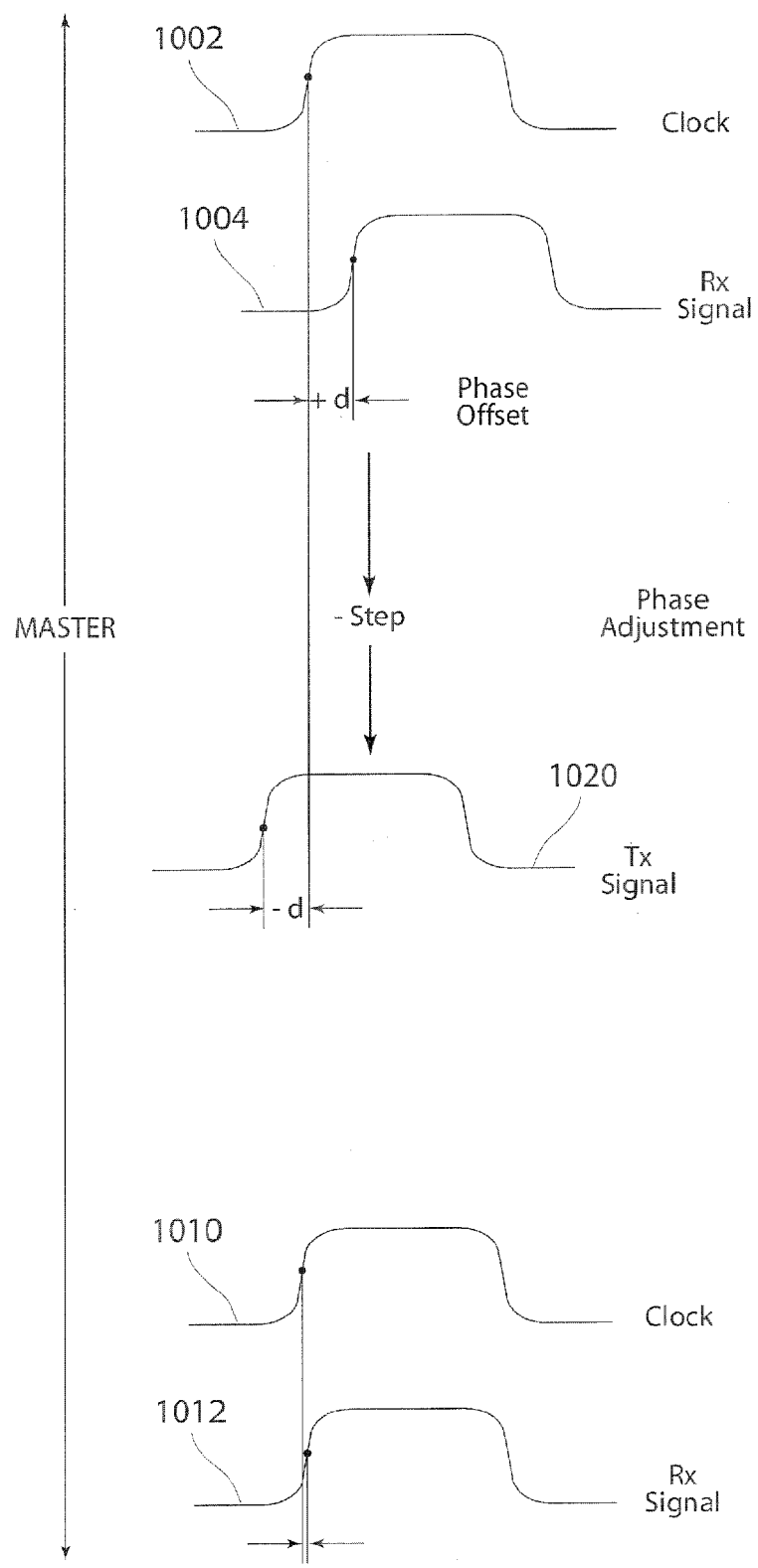
FIG. 16 illustrates an example of a signal corresponding to operation of the embodiment of FIG. 15.

FIG. 15 is a block diagram of a preferred embodiment where the master adjusts its transmit signal to compensate for phase offset in its received signal. The architecture of this embodiment is like that described with respect to FIG. 12, except for the position of the phase adjuster 650. The phase adjuster 650 modifies the clock signal 606 by a phase shift in a direction opposite to the phase offset, calculated by the phase comparator 602, to produce a phase adjusted clock signal 651. In response to the phase adjusted clock signal 651, the transmitter 624 produces a transmit signal whose phase is opposite to the measured phase offset. Referring to the example illustrated in FIG. 16, the phase offset between the clock signal 1002 and the received signal 1004 is +d. The phase adjustment applies a (− step) change in the phase of the clock signal 606 to produce the phase adjusted clock signal 651. As a result, the transmit signal 1020 has a phase of approximately −d. When this transmit signal 1020 is received at the slave 664, the CDR module 616 locks to the adjusted phase and produces a clock signal 617 with a phase of approximately −d. Since the timing of the slave's transmitter 626 is controlled by the phase adjusted clock signal 617, the slave's transmit signal also has a phase of approximately −d. This phase is substantially cancelled by propagation over link 627. When the slave's transmit signal is received by the master 660, the master's received signal 636 is more aligned with the clock signal 606, as shown by the signals 1010 and 1012 in FIG. 16.

Figure 17:
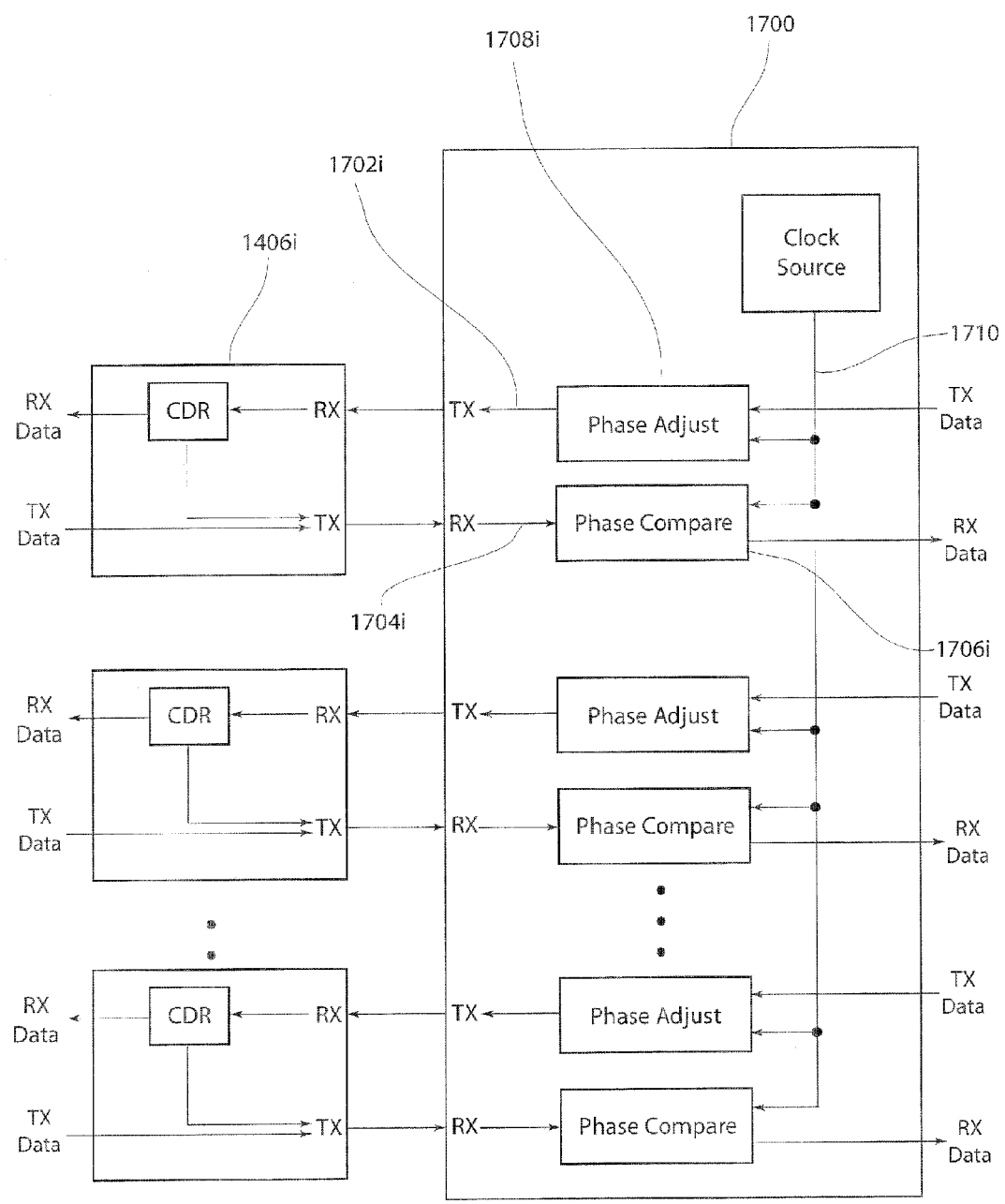
FIG. 17 is a block diagram of a master linked to multiple slaves corresponding to the embodiment of FIG. 15.

FIG. 17 is a block diagram of a master linked to multiple slaves corresponding to the embodiment of FIG. 15. The master 1700 includes a phase comparator 1706$i$ for each received signal 1704$i$ from each slave device 1406$i$ to measure a corresponding phase offset. Each phase adjuster 1708$i$ adjusts the phase of the clock signal 1710 so that each transmit signal 1702$i$ has a phase that is opposite to the corresponding measured phase offset.

Figure 18:
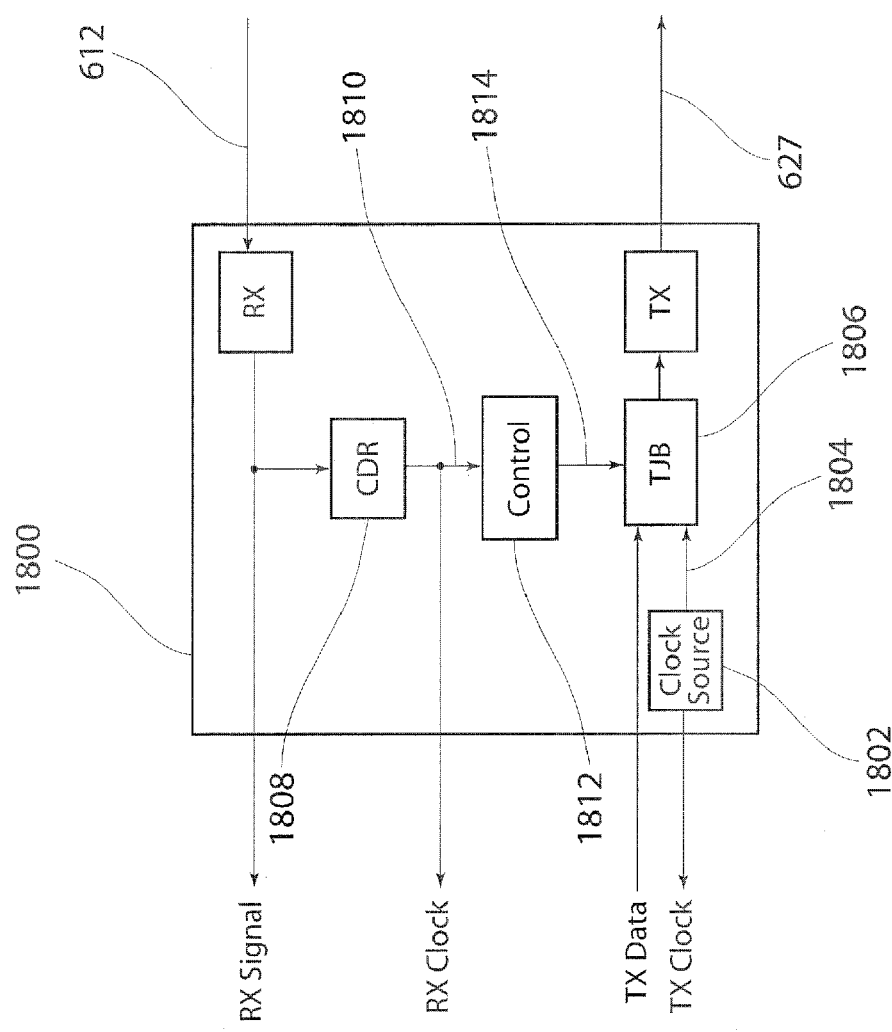
FIG. 18 is a block diagram of an alternative embodiment for the slave device in FIGS. 12 and 15.

FIG. 18 is a block diagram of an alternative embodiment for the slave device 664 in FIGS. 12 and 15. The slave device 1800 includes a clock source 1802, so it corresponds to the datacom model. The CDR 1808 recovers the frequency and phase of an embedded clock of the received signal to generate a clock signal 1810 that matches the frequency of the transmit clock of the master device. The controller 1812 controls the transmit jitter buffer 1806 to form the transmit signal in accordance with the recovered clock signal 1810 instead of the TX clock signal 1804 output by the clock source 1802. This allows the slave 1800 to transmit at the frequency of the master's clock, instead of its own clock 1804. Since the slave's transmit signal is matched in frequency to the master's clock, the master can perform the phase measurements and adjustments described with respect to FIGS. 12 and 15.

Embodiments of the present invention reduce the complexity of a master device that is interconnected with one or more slave devices by eliminating the PLL in the master device that would be required for each connection in conventional architectures. Referring back to FIG. 5 showing a block diagram of a PLL, the conventional PLL includes a phase comparator 500, a loop filter 506 and a controlled oscillator 512. Embodiments of the present invention include a phase comparator, but do not require the loop filter 506 or the controlled oscillator 512 in the master device. The PLL in the CDR at the slave device provides that the slave's transmit signal is synchronized in frequency with the master's clock signal. Simpler phase adjustment operations by the master or slave provide the phase compensation in the received signal at the master device. Several applications are described in the following.

In an application with an ADC in communication with a digital processor, an embodiment of the present invention implements the operations of the master in the digital processor. The ADC converts an input analog signal to a digital signal that is transferred to the digital processor. The slave's operations can be implemented in a digital portion of the ADC device or a digital interface for transferring the digital signal from the ADC to the digital processor.

The applications for ADC can be used in a digital radio system. An embodiment of the present invention positions the ADC near the (AFE) of the receiver of a digital radio system. The ADC digitizes the received analog signal and transfers it the over a digital link to a digital processor for signal processing and demodulation operations.

In an application where a digital processor is connected with one or more memory devices, an embodiment of the present invention implements the operations of the master in the digital processor and the operations of the slave in the memory device. The embodiments where the master performs the phase adjustment operations, described with respect to FIGS. 12 and 15, are preferable because the simpler architecture of the slave is preferable for the memory device.

Specific implementations of the master and slave devices depend on the application and the functions of the interconnected devices. Implementations of master and slave operations can use one or more digital processing technologies appropriate for the application, including FPGA, complex programmable logic devices (CPLD), ASIC, digital signal processor (DSP), microcontroller and microprocessor. For the embodiments of FIGS. 6, 8 and 9, a phase comparator and control symbol encoder can be implemented instead of a PLL in the master device. For the embodiments of FIGS. 12 and 15, a phase comparator and phase adjuster can be implemented instead of a PLL in the master device. For the embodiments of FIGS. 6, 7 and 9, implementation of the slave includes operations for control symbol decoding and for phase compensation of the transmit signal. For the embodiment of FIG. 18, implementation of the slave includes operations for phase compensation of the transmit signal. Reducing the requirements for PLLs in the master significantly reduces the complexity of the communications overhead for the device and frees resources for other aspects of the application.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. In a system having at least two devices in communication with each other, wherein a first device and a second device are coupled by a data transfer link, a method for reducing a phase offset of a signal received at the first device, comprising:
   at the first device,
   receiving a first received signal at the first device transmitted from the second device over the data transfer link;
   measuring the phase offset between the first received signal and a clock signal from a clock source in the first device to form a first phase offset;
   generating a control symbol based on the first phase offset;
   inserting the control symbol in a first transmit signal;
   transmitting the first transmit signal from the first device to the second device over the data transfer link;
   at the second device,
   receiving the first transmit signal to form a second received signal, wherein the second received signal contains the control symbol;
   applying a phase lock loop to the second received signal by to form a recovered clock signal;
   extracting the control symbol from the second received signal;
   applying a phase shift to a second transmit signal in accordance with the control symbol and the recovered clock signal, wherein the second transmit signal has a compensated phase;
   transmitting the second transmit signal from the second device to the first device over the data transfer link; and
   at the first device,
   receiving the second transmit signal at the first device to form a compensated received signal having a second phase offset that is smaller than the first phase offset of the first received signal.

2. The method of claim 1, further comprising:
   at the first device,
   transmitting a prior signal from the first device to the second device in accordance with the clock signal;
   at the second device,
   receiving the prior signal at the second device to form a received prior signal;
   applying the phase lock loop to the received prior signal by to form a prior recovered clock signal;
   generating a prior transmit signal in accordance with the prior recovered clock signal; and
   transmitting the prior transmit signal to the first device, the prior transmit signal forming the first received signal at the first device.

3. The method of claim 1, wherein at the first device, the step of inserting the control symbol further comprises:
   inserting the control symbol in a control portion of the first transmit signal.

4. The method of claim 1, wherein at the first device, the step of inserting the control symbol further comprises:
   inserting the control symbol in an idle signal, the idle signal comprising the first transmit signal.

5. The method of claim 1, wherein at the first device, the step of measuring the phase offset further comprises:
   comparing a signal phase of the first received signal to a clock phase of the clock signal to determine the first phase offset.

6. The method of claim 1, wherein the first received signal contains a training pattern represented at the first device in a reference training pattern, the step of measuring the phase offset further comprising:
   at the first device,
   extracting the training pattern from the first received signal to form a received training pattern; and
   comparing the received training pattern with the reference training pattern to determine the first phase offset.

7. The method of claim 1, further comprising:
   at the first device,
   inserting a training pattern in a first prior transmit signal;
   transmitting the first prior transmit signal over the data transfer link to the second device;
   at the second device,
   receiving the first prior transmit signal to form a received prior signal, the received prior signal containing the training pattern; and
   transmitting the training pattern in a second prior transmit signal, the second prior transmit signal forming the first received signal at the first device.

8. The method of claim 1, wherein the step of applying a phase shift to a second transmit signal in accordance with the control symbol further comprises:
   at the second device,
   adjusting a time shift of the second transmit signal using a jitter buffer, wherein the time shift corresponds to the phase shift in accordance with the control symbol.

9. The method of claim 1, wherein the step of applying a phase shift to a second transmit signal in accordance with the control symbol further comprises:
   at the second device,
   adjusting the recovered clock signal in accordance with the control symbol to form a phase compensated clock signal; and
   generating the second transmit signal in accordance with the phase compensated clock signal.

10. The method of claim 1, wherein at the first device, the step of inserting the control symbol in a first transmit signal further comprises:
    encoding the control symbol in accordance with an 8B/10B code.

11. The method of claim 1, wherein at the second device, the step of extracting the control symbol from the second received signal further comprises:
    decoding the control symbol in accordance with an 8B/10B code.

12. The method of claim 1, wherein the second device includes an analog to digital converter, the method further comprising:
at the second device,
sampling an analog signal using the analog to digital converter to form a plurality of signal samples; and
encoding the signal samples to form the second transmit signal for the step of applying a phase shift.

13. The method of claim 1, wherein the first device comprises a field programmable gate array performing the steps of the first device.

14. The method of claim 1, wherein the second device comprises a field programmable gate array performing the steps of the second device.

15. In a system having at least two devices in communication with each other, wherein a first device and a second device are coupled by a data transfer link, an apparatus for reducing a phase offset of a signal received at the first device, comprising:
at the first device,
a first receiver coupled to receive a first received signal from the data transfer link, wherein the first received signal was transmitted from the second device;
a clock source that generates a clock signal;
a phase comparator coupled to the first receiver and the clock source, the phase comparator determining a first phase offset between the first received signal and the clock signal;
a control symbol generator coupled to the phase comparator and generating a control symbol based on the first phase offset;
an encoder coupled to the control symbol generator, the encoder inserting the control symbol in a first transmit signal;
a first transmitter coupled to the encoder and the data transfer link, wherein the first transmitter transfers the first transmit signal over the data transfer link to the second device;
at the second device,
a second receiver coupled to receive the first transmit signal from the data transfer link to form a second received signal;
a phase lock loop coupled to receive the second received signal from the second receiver, the phase lock loop generating a recovered clock signal synchronized with the second received signal;
a decoder coupled to the second receiver, the decoder extracting the control symbol from the second received signal;
a phase compensator coupled to receive the control symbol and recovered clock signal, the phase compensator responding to the control symbol and the recovered clock signal to produce a second transmit signal having a phase shift in accordance with the control symbol; and
a second transmitter coupled to the phase compensator and the data transfer link, the second transmitter transmitting the second transmit signal over the data transfer link to the first device, wherein at the first device, the first receiver receives the second transmit signal to form a compensated received signal having a second phase offset that is smaller than the first phase offset of the first received signal.

16. The apparatus of claim 15, wherein at the first device, the encoder inserts the control symbol in a control portion of the first transmit signal and in the second device, the decoder extracts the control symbol from the control portion of the second received signal.

17. The apparatus of claim 15, wherein at the first device, the encoder inserts the control symbol in an idle signal, the idle signal comprising the first transmit signal.

18. The apparatus of claim 15, wherein at the first device, the phase comparator compares a signal phase of the first received signal to a clock phase of the clock signal to determine the first phase offset.

19. The apparatus of claim 15, wherein the first received signal contains a training pattern represented at the first device in a reference training pattern, the phase comparator further comprising:
a pattern decoder coupled to the first receiver and extracting the training pattern from the first received signal to form a received training pattern; and
a data comparator coupled to the pattern decoder and comparing the received training pattern to the reference training pattern to determine the first phase offset.

20. The apparatus of claim 15, further comprising:
at the first device,
a training pattern generator coupled to the first transmitter and inserting a training pattern in a first prior transmit signal, the first transmitter transmitting the first prior transmit signal over the data transfer link to the second device; and
at the second device,
a loopback controller coupled to the second receiver and the second transmitter, the second receiver receiving the first prior transmit signal to form a received prior signal containing the training pattern and the second transmitter responding to the loopback controller to transmit the training pattern in a second prior transmit signal over the data transfer link to the first device, the second prior transmit signal forming the first received signal at the first device.

21. The apparatus of claim 15, wherein at the second device, the phase compensator further comprises:
a jitter buffer coupled to the second transmitter, the jitter buffer responding to the control symbol and the recovered clock signal to adjust a time shift of the second transmit signal, wherein the time shift corresponds to the phase shift in accordance with the control symbol.

22. The apparatus of claim 15, wherein at the second device, the phase compensator further comprises:
a clock phase shifter coupled to receive the recovered clock signal, wherein the clock phase shifter adjusts a recovered clock phase of the recovered clock signal in accordance with the control symbol to form a phase compensated clock signal, the second transmitter generating the second transmit signal in accordance with the phase compensated clock signal.

23. The apparatus of claim 15, wherein the encoder encodes the control symbol in accordance with an 8B/10B code.

24. The apparatus of claim 15, wherein the decoder decodes the control symbol in accordance with an 8B/10B code.

25. The apparatus claim 15, wherein the second device further comprises:
an analog to digital converter coupled to receive an analog signal and producing a plurality of signal samples; and
a signal encoder coupled to receive the signal samples from the analog to digital converter, the signal encoder encoding the signal samples to form the second transmit signal and providing the second transmit signal to the phase compensator.

26. The apparatus of claim 15, wherein the first device is implemented in a field programmable gate array.

27. The apparatus of claim 15, wherein the second device is implemented in a field programmable gate array.

28. In a system having at least two devices in communication with each other, wherein a first device and a second device are coupled by a data transfer link, a method for reducing a phase offset of a signal received at the first device, comprising:
at the first device,
receiving a first received signal at the first device transmitted from the second device over the data transfer link;
measuring the phase offset between the first received signal and a clock signal from a clock source in the first device to form a first phase offset;
adjusting the clock signal by applying a phase shift in a direction opposite to the first phase offset to form a phase shifted clock signal;
forming a first transmit signal in accordance with the phase shifted clock signal;
transmitting the first transmit signal from the first device to the second device over the data transfer link;
at the second device,
receiving the first transmit signal to form a second received signal;
applying a phase lock loop to the second received signal to produce a recovered clock signal;
forming a second transmit signal in accordance with the recovered clock signal;
transmitting the second transmit signal from the second device to the first device over the data transfer link; and
at the first device,
receiving the second transmit signal to form a compensated received signal, wherein a second phase offset of the compensated received signal is smaller than the first phase offset of the first received signal.

29. The method of claim 28, further comprising:
at the first device,
transmitting a prior signal from the first device to the second device in accordance with the clock signal;
at the second device,
receiving the prior signal at the second device to form a received prior signal;
applying the phase lock loop to the received prior signal to form a prior recovered clock signal;
generating a prior transmit signal in accordance with the prior recovered clock signal; and
transmitting the prior transmit signal to the first device, the prior transmit signal forming the first received signal at the first device.

30. The method of claim 28, wherein at the first device, the step of measuring the phase offset further comprises:
comparing a signal phase of the first received signal to a clock phase of the clock signal to determine the first phase offset.

31. The method of claim 28, wherein the first received signal contains a training pattern represented at the first device in a reference training pattern, the step of measuring the phase offset further comprising:
at the first device,
extracting the training pattern from the first received signal to form a received training pattern; and
comparing the received training pattern with the reference training pattern to determine the first phase offset.

32. The method of claim 28, further comprising:
at the first device,
inserting a training pattern in a first prior transmit signal;
transmitting the first prior transmit signal over the data transfer link to the second device;
at the second device,
receiving the first prior transmit signal to form a received prior signal, the received prior signal containing the training pattern; and
transmitting the training pattern in a second prior transmit signal, the second prior transmit signal forming the first received signal at the first device.

33. The method of claim 28, wherein the first device comprises a field programmable gate array performing the steps of the first device.

34. The method of claim 28, wherein the second device comprises a field programmable gate array performing the steps of the second device.

35. In a system having at least two devices in communication with each other, wherein a first device and a second device are coupled by a data transfer link, an apparatus for reducing a phase offset of a signal received at the first device, comprising:
at the first device,
a first receiver coupled to receive a first received signal from the data transfer link, wherein the first received signal was transmitted from the second device;
a clock source that generates a clock signal;
a phase comparator coupled to the first receiver and the clock source, the phase comparator determining a first phase offset between the first received signal and the clock signal;
a clock phase adjuster coupled to receive the clock signal and the first phase offset, the clock phase adjuster applying a phase shift to the clock signal in a direction opposite to the first phase offset to form a phase shifted clock signal;
a phase compensator coupled to receive the phase shifted clock signal and forming a first transmit signal in accordance with the phase shifted clock signal;
a first transmitter coupled to the phase compensator and the data transfer link, wherein the first transmitter transmits the first transmit signal over the data transfer link to the second device;
at the second device,
a second receiver coupled to receive the first transmit signal from the data transfer link to form a second received signal;
a phase lock loop coupled to receive the second received signal, the phase lock loop generating a recovered clock signal synchronized with the second received signal; and
a second transmitter responding to the recovered clock signal to produce a second transmit signal synchronized with the recovered clock signal, the second transmitter transmitting the second transmit signal over the data transfer link to the first device, wherein at the first device, the first receiver receives the second transmit signal to form a compensated received signal having a second phase offset that is smaller than the first phase offset of the first received signal.

36. The apparatus of claim 35, wherein at the first device, the phase comparator compares a signal phase of the first received signal to a clock phase of the clock signal to determine the first phase offset.

37. The apparatus of claim 35, wherein the first received signal contains a training pattern represented at the first device in a reference training pattern, the phase comparator further comprising:
a pattern decoder coupled to the first receiver and extracting the training pattern from the first received signal to form a received training pattern; and a data comparator coupled to the pattern decoder and comparing the received training pattern to the reference training pattern to determine the first phase offset.

38. The apparatus of claim 35, further comprising:

at the first device, a training pattern generator coupled to the first transmitter and inserting a training pattern in a first prior transmit signal, the first transmitter transmitting the first prior transmit signal over the data transfer link to the second device; and at the second device, a loopback controller coupled to the second receiver and the second transmitter, the second receiver receiving the first prior transmit signal to form a received prior signal containing the training pattern and the second transmitter responding to the loopback controller to transmit the training pattern in a second prior transmit signal over the data transfer link to the first device, the second prior transmit signal forming the first received signal at the first device.

39. The apparatus of claim 35, wherein the first device is implemented in a field programmable gate array.

40. The apparatus of claim 35, wherein the second device is implemented in a field programmable gate array.

* * * * *